(12) United States Patent
Huber et al.

(10) Patent No.: US 7,672,649 B2
(45) Date of Patent: Mar. 2, 2010

(54) CONTROLLER FOR A RADIO-FREQUENCY AMPLIFIER

(75) Inventors: Klaus Huber, Effeltrich (DE); Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 479 days.

(21) Appl. No.: 11/744,291

(22) Filed: May 4, 2007

(65) Prior Publication Data

US 2007/0259630 A1 Nov. 8, 2007

(30) Foreign Application Priority Data

May 4, 2006 (DE) .................. 10 2006 020 830

(51) Int. Cl.
*H01Q 11/12* (2006.01)
*H04B 1/00* (2006.01)
(52) U.S. Cl. .................. 455/127.2; 455/114.3; 455/126; 375/296
(58) Field of Classification Search .............. 455/114.3, 455/126, 127.1, 127.2; 330/149; 375/296
See application file for complete search history.

(56) References Cited

U.S. PATENT DOCUMENTS 6,075,411 A * 6/2000 Briffa et al. .................. 330/149
6,876,197 B2 4/2005 Albrecht et al.
6,993,301 B1 * 1/2006 Kenington et al. ....... 455/114.3
7,123,890 B2 10/2006 Kenington et al.

* cited by examiner

*Primary Examiner*—Lee Nguyen
(74) *Attorney, Agent, or Firm*—Schiff Hardin LLP

(57) ABSTRACT

A controller for an RF amplifier, in particular for a RF amplifier of an MR tomography apparatus, has an IQ control element for adjusting the magnitude and phase an RF signal that is be fed to the RF amplifier. The IQ control element has a signal splitter that splits the RF signal into two partial signals having a 90° phase offset in an I path and a Q path, each having a multiplier for multiplying the partial signal by an I factor in the I path and a Q factor in the Q path. A summing unit recombines the partial signals. A detector determines the actual phase difference and actual amplification between the RF signal fed to the IQ control element and the RF signal amplified by the RF amplifier. An IQ controller determines the I factor and the Q factor from the actual difference and a desired phase difference and the actual amplifier and a desired amplification. The IQ controller has an operating point at which the I factor and the Q factor are the same magnitude if the actual and desired phase differences and the actual and desired amplifications are the same.

8 Claims, 4 Drawing Sheets

CONTROLLER FOR A RADIO-FREQUENCY AMPLIFIER

BACKGROUND OF THE INVENTION

1. Field of the Invention

The present invention concerns a controller for a radio-frequency amplifier.

2. Description of the Prior Art

A radio-frequency amplifier (RF amplifier) serves to as identically as possible amplify a radio-frequency signal (RF signal) led to it in order to obtain a RF signal of greater power at its output. RF signals having pulse powers of 15 to 30 kW are necessary particularly for special medical examinations by means of magnetic resonance tomography (MRT). RF amplifiers are therefore employed in MRT systems for producing RF signals having power in this range. The RF signals are pulsed, meaning they require such power for a period ranging from a few μs to a few ms. Very precise pulsed power is necessary at the RF amplifier's output, especially in the case of functional MRI (magnetic resonance imaging), in order to produce high-quality medical images using the MRT apparatus. A pulse-repetition accuracy of the amplified RF signal in the order of approximately 1-4% can be achieved using a conventional transmission arrangement. The term "precise" in this context means that both the amplitude and phase of the RF signal have to meet exact specifications. To obtain accuracies of this order for the RF amplifier's RF output signal, the amplifier is oriented with regulating means.

A transmission arrangement for a magnetic resonance apparatus is known from DE 103 35 144 B3 that has controlling means for the amplitude and phase of the RF amplifier's RF output signal. The ratio between the RF amplifier's input and output power, namely the RF signal that is to be amplified to produce the amplified RF signal (called the actual amplification or actual gain), is determined by suitable detectors. The phase relationship between said two signals is also determined (called the actual phase difference). For example, an integrated gain and phase detector, for instance an AD8302 chip from the company Analog Devices, can be used for that purpose. A settable attenuator and settable phase control element are used in two separate control loops for keeping the RF output signal's output amplitude and output phase constant or at the desired ratio to the RF input signal, i.e., for setting a desired amplification (desired gain) or desired phase difference.

FIG. 4 shows an arrangement according to the prior art. A controller 202 is connected upstream of an amplifier 200, also called an RFPA (Radio Frequency Power Amplifier). A RF input signal 206 is fed into the arrangement at an input 204. This signal proceeds through the controller 202 and the amplifier 200 via the signal line 208, to exit the arrangement as an amplified RF output signal 212 at the output 210. The controller 202 has both a gain detector 214 and a phase detector 216.

Two measured variables, for both the RF input signal 206 and the RF output signal 212, are fed, via respective signal couplers 218 and 220 assigned to the input 204 and output 210 and via corresponding measuring leads 222 and 224, both to the gain detector 214 and to the phase detector 216. The gain detector 214 determines the actual amplitude amplification 226 (actual gain) and the phase detector 216 determines the actual phase difference 228 between the RF output signal 212 and RF input signal 206. High frequency energy (RF signals) in a range around 63 or 123 MHz, for example, is present on the measuring leads 222, 224.

The actual amplitude amplification 226 and actual phase difference 228, by contrast, as output signals of the gain detector 214 and phase detector 216, are low-frequency signals (LF signals). The actual amplitude amplification 222 and actual phase difference 228 are compared in comparators 230, 232 with a desired amplification 234 and desired phase difference 236 and appropriate correction signals are conveyed via control amplifiers 238, 240 to an attenuator 242 and a phase control element 244 in the signal line 208.

The signal paths all run separately from each other, so the attenuator 242 and the phase control element 244 consequently have mutually independent, separate control loops 246, 248. An integrated gain and phase detector, mentioned above, can alternatively combine the two discrete gain detector 214 and phase detector 216 components in the form of an IC 250, indicated in FIG. 4 by dashed outlining.

Especially in the case of MRT, for example, the input signals 206 and output signal 212 often have, in certain circumstances relatively short rise times, for example in the range of 10 □s. The attenuator 242 and phase control element 244 therefore must have rise times that are just as short, or preferably even shorter. Particularly with regard to the phase control element 244, this can cause problems in terms of implementation and costs.

Cascading of the attenuator 242 and phase control element 244 in the signal line 208 also causes a further problem because these are not ideal control elements. Thus, for example, the phase control element 244 can exhibit or cause amplitude errors and/or the amplitude control element, meaning the attenuator 242 can exhibit or cause phase errors. The two control loops 246, 248 as a result will no longer be mutually independent. In the worst case that can lead to undesired transient oscillations in the controller 202. Although it is conceivable to employ control elements of sufficiently high quality, or virtually ideal control elements that could reliably obviate the aforementioned problems, such elements are very demanding in terms of circuitry, thus adding to costs.

It is also known, instead of the cascaded amplitude control element 242 and phase control element 244, to provide an IQ control element (not shown) in the signal path 208 to the RF amplifier 200. The RF signal 206 requiring to be amplified is led to the IQ control element and split into two partial signals having a 90° phase offset. The partial signals then each traverse an I path and a Q path. The corresponding partial signal is weighted in the I path with an I factor and in the Q path with a Q factor. The partial signals are recombined in a summing unit and led to the RF amplifier 200. The IQ control element also influences the magnitude and phase of the RF signal 206 requiring to be led to the RF amplifier. However, multiplying the partial signals with the I and Q factor in each case influences only the amplitude of the partial signals and not their phase. Because the partial signals correspond, due to the 90° phase offset, to a real and imaginary component of a complex phasor (namely their sum), by the addition of the real and imaginary component, in the form of the IQ controller's output signal fed to the amplifier, the change in the respective amplitudes of the partial signals causes this total signal to be altered in amplitude or phase.

An IQ control element of this type embodied in analog form is readily able to provide the required rise times of far below 1 μs. For driving the IQ element it will, however, then be necessary to convert the intended phase and amplification changes, meaning the changes in amplitude in the RF signal (desired and actual values), into respective I and Q factors in keeping with the amplification factors for the real and imaginary component (partial signals in the partial paths). That could be done by A/D conversion and by means of digital calculations performed by a digital computer, but that would involve not inconsiderable computing time and effort. For that purpose, signals have to be converted from analog to digital, or vice versa, and corresponding computing operations performed. This is computing-intensive and expensive, especially in view of the timing constraints.

SUMMARY OF THE INVENTION

An object of the present invention is to provide an improved controller for a RF amplifier, in particular for a RF amplifier of an MR tomography apparatus.

This object is achieved by a controller according to the invention having an IQ controller of the type described above, but according to the invention the IQ controller has an operating point at which the I and Q factors are the same magnitude if the actual and desired phase difference and the actual and desired amplification are the same. In terms of the complex representation of the partial signals having a 90° phase offset, that means that the operating point of the IQ controller or IQ control element is selected such that the summation signal of the real and imaginary components is at 45° in the vector diagram. That corresponds to the inventive equal weighting of the respective partial signals equal in magnitude (having equal amplitudes). If, however, the IQ control element is operated inventively at a normal phase of 45°, then a change solely in the output phase, meaning the phase of the summation signal, will be achieved solely by the respective I and Q paths of the control elements being driven in push-pull mode, namely with the I and Q factors being incremented and decremented in push-pull mode. That is why, especially for minor changes, there will be no change in amplitude in an initial approximation, only a change in the phase of the sum vector.

By contrast, a change solely in the output signal's amplitude will be produced exactly, by driving the I and Q factors purely in common mode, meaning that these factors are simultaneously and equally incremented or, as the case may be, decremented. In the complex vector diagram the sum vector of the voltages from the partial I signal and Q signal consequently will undergo a change in its magnitude only, but not in its phase.

The operating point of the IQ control element occurs when the RF signal being fed to it is not being influenced, meaning when this signal proceeds through the IQ control element unchanged. The desired and actual values for gain and phase difference will then correspond; the IQ controller will not need to intervene in a controlling manner. That will be necessary only when the desired and actual values differ and the IQ control element deviates from its operating point, so as to pass the RF input signal being fed to the control element to the RF amplifier in changed form, thereby preparing the RF signal that is to be amplified.

An advantage of the controller according to the invention is that determining the I and Q factor from the corresponding actual and desired phase differences and amplifications is particularly simple and does not require any intensive computing operations or A-D converting.

The IQ controller therefore can be an analog IQ controller. It is especially fast and simple to implement analog circuitry for driving the I and Q factors in the common and push-pull modes. Time losses involved in AND or D/A converting and performing relevant calculations of the I and Q factors from the corresponding desired and actual phase differences and amplifications are eliminated. The controller is thereby made sufficiently fast so as to be able to readily provide the required short rise times.

Especially for the aforementioned relatively minor adjustment or influencing by the IQ control element of the RF signal's magnitude and phase around the operating point, meaning just fine tuning, the two control loops in the IQ controller, namely those for the I and Q factors, can be mutually decoupled to a high degree. In practice this means the RF signal has been adjusted in terms of its magnitude and phase with deviations from the operating point of around 20%. Mutual influence and hence spiking of the inventive controller has in that way prevented. The IQ controller therefore can have two parallel, mutually decoupled control loops respectively for the I and Q factors.

The two control loops thus can be of identical structure. As a result, the circuitry will be symmetrical in design and particularly simple. The two control loops will then have the same characteristics, for example in terms of temperature stability and the like.

The aforementioned simple driving of the I and Q factors in common or in push-pull mode will be especially easy to implement in terms of circuitry in an embodiment wherein each control loop is provided with a differential amplifier, with each of these being driven in each path by desired and actual values of the amplification in common mode. Driving of the differential amplifiers for the difference in desired and actual phase is in contrast thereto implemented between the two control loops using push-pull mode. A difference in amplitude between the desired and actual amplification thus will in both control loops, result in a common-mode output signal from the differential amplifiers; a difference between the desired and actual phase difference will produce a push-pull output signal. The aforementioned driving of the IQ controller by the I and Q factors, corresponding to the described output signals, is thus implemented particularly simply by means of an analog split. For example, it is possible in the I path to route the desired amplification and actual phase difference to the differential amplifier's non-inverting input and the actual amplification and desired phase difference to its inverting input and, in the Q path, to route the desired amplification and desired phase difference to its non-inverting input and the actual amplification and actual phase difference to its inverting input.

A PI controller can, in each control loop be connected downstream of the corresponding differential amplifiers, with the PI controllers generally being identical. The controller alternatively may operate according to other control characteristics (for example PID, I, . . . ).

Due to the resulting particularly simple correlations between the phase differences and amplifications and the I and Q factor, it is possible to exploit the advantages of simple detection, for example using an integrated logarithmic detector for the detector, and the advantages during the controlling operation, which is to say using a fast IQ control element.

The detector therefore can be an integrated logarithmic detector that operates particularly reliably and quickly and is appropriately temperature-compensated, for example, in advance.

DESCRIPTION OF THE PREFERRED EMBODIMENTS

Figure 1:
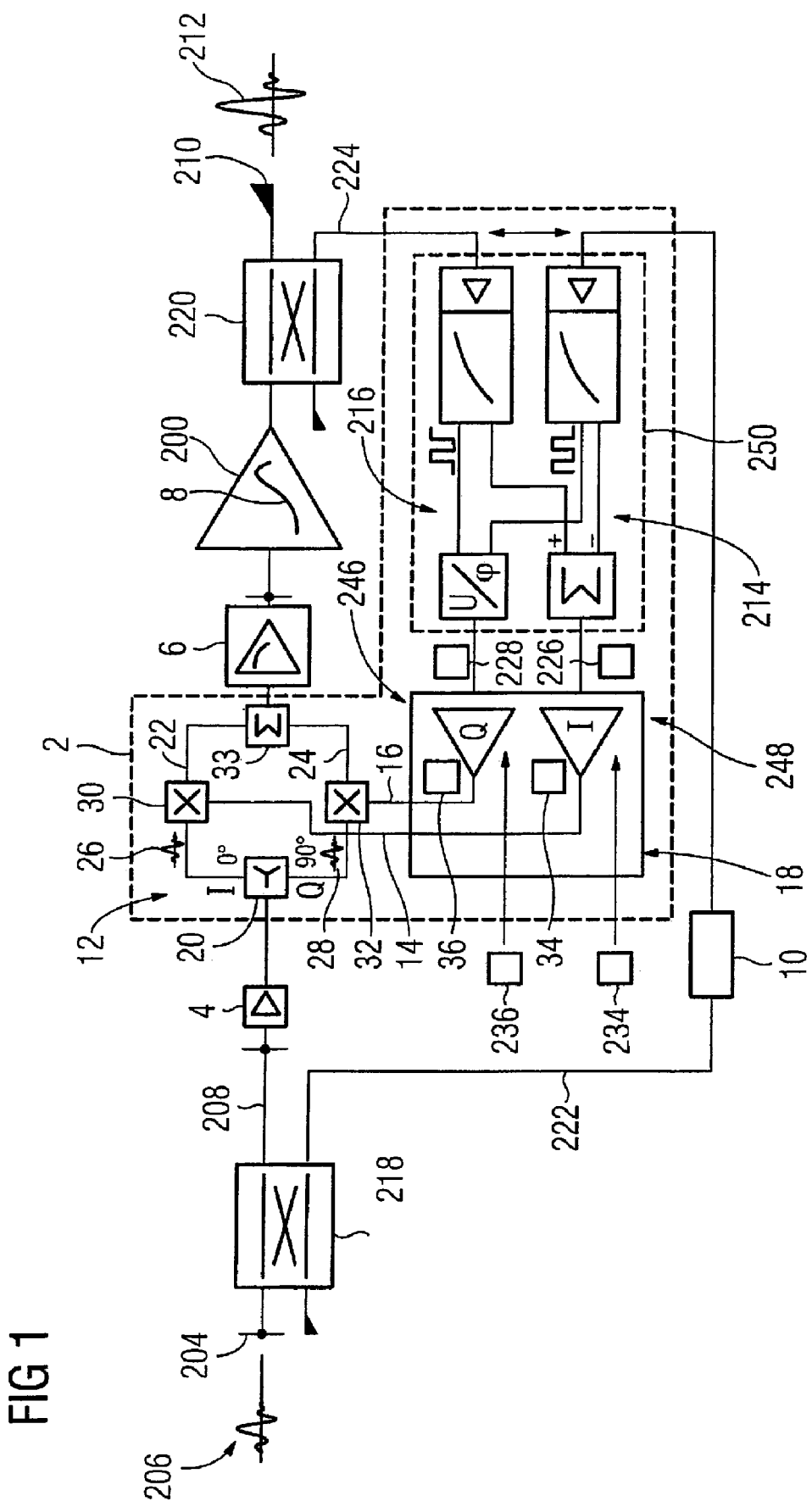
FIG. 1 shows an inventive controller interconnected with a RF amplifier.
Figure 4:
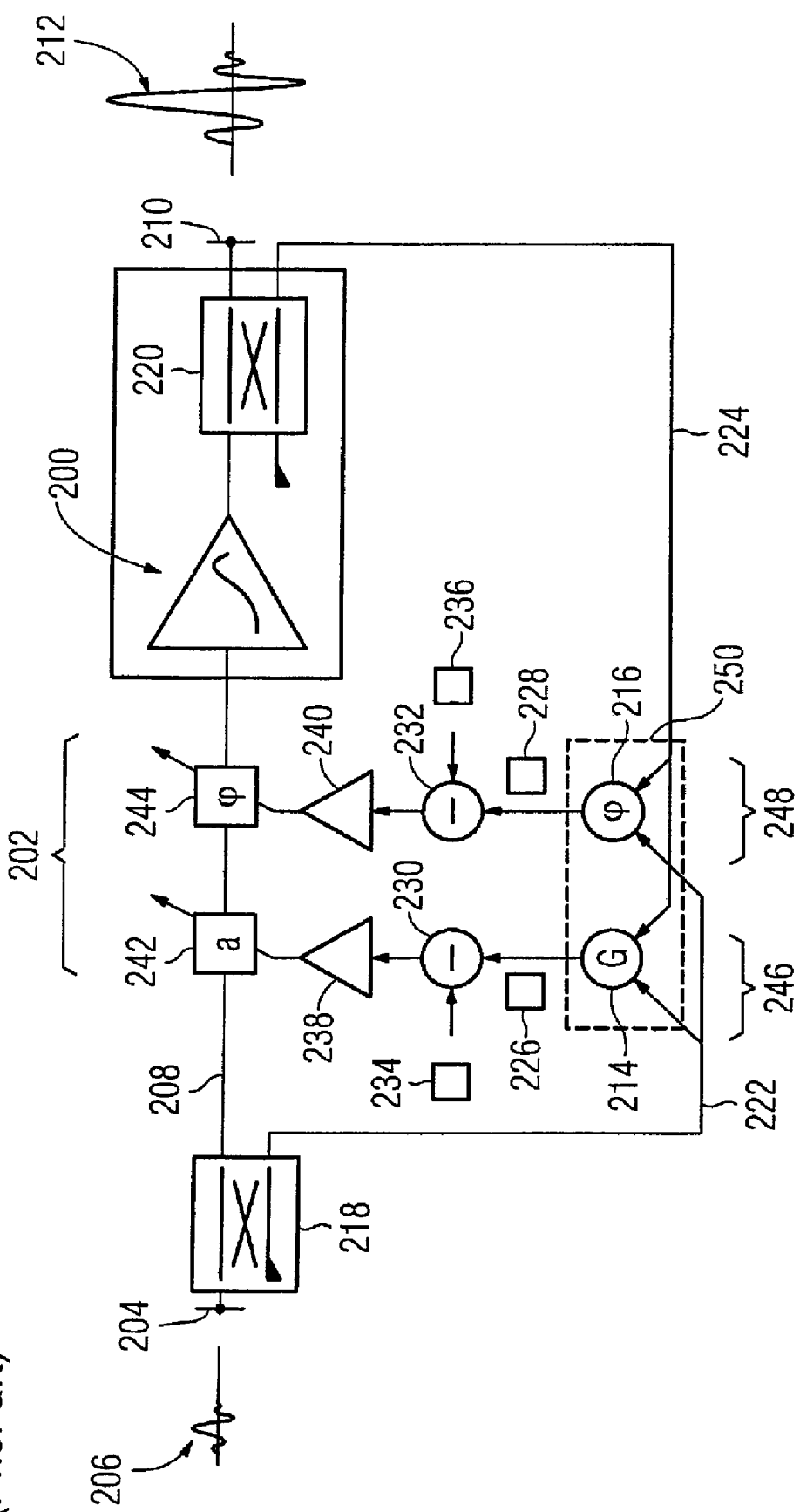
FIG. 4, as discussed above, shows a conventional controller.

FIG. 1 shows an amplifier assembly, but wherein the known controller 202 has been replaced with an inventive controller 2. The components already known from FIG. 4, which have correspondingly identical reference numerals, will not be explained again where not essential for FIG. 1.

Connected additionally into the signal line 208 between the input 204 and controller 2 is a pre-amplifier 4 for pre-amplifying the RF input signal 206. Also connected between the controller 2 and the amplifier 200 is a pre-emphasizer 6 whose purpose is to compensate the non-linear amplification characteristic 8 of the amplifier 200. Further connected into the measuring lead 222 is a frequency-dependent time-delay element 10 for group delay equalizing Tgd(f) between the signal coupler 218 and IC 250.

The IC 250 in the controller 2 is in FIG. 1 shown schematically according to its internal structure, which need not be described in further detail herein. As in FIG. 1, it is fed by the measuring lines 222 and 224 for determining the actual amplitude amplification 226 and phase difference 228.

The controller 2 contains an IQ control element 12 that is connected into the signal line 208 and connected to an IQ controller 18 via two signal lines 14, 16. The IQ control element 12 has a signal splitter 20 that is connected to the pre-amplifier 4 and splits the pre-amplified RF input signal 206 onto an I path 22 and a Q path 24. The partial signal 26, derived from the RF input signal 206, in the I path 22 has a −90° phase offset relative to the partial signal 28 in the Q path 24. Each of the two partial paths contains a multiplier 30, 32 for multiplying each of the partial signals 26, 28 by an I factor 34 and a Q factor 36. These are generated by the IQ controller 18 and fed to the IQ control element 12 via the signal leads 14, 16. The RF signal 206 matched in magnitude and amplitude by the multipliers 30, 32 is recombined by the summing unit 33 from the partial signals 26, 28 and are fed to the pre-emphasizer 6.

For determining the I factor 34 and Q factor 36 the IQ controller 18 is provided with actual values, which is to say the actual amplitude amplification 226 and actual phase difference 228, and with desired values, namely the desired amplification 234 and desired phase difference 236.

The overall amplifier arrangement shown in FIG. 1 has been dimensioned in combination with the controller 2 such that the actually intended or theoretically desired amplification will be insured for the RF output signal 212 with no controlling intervention, meaning with unchanged looping-through of the RF input signal 206 from the amplifier 4 to the pre-emphasizer 6. The controller 2 thus serves only to finely correct the RF signal 206 in terms of amplitude and phase within a small range, the purpose being to compensate imponderable non-linearities or temperature drifts in the overall arrangement.

The operating point (38) of the IQ controller 18 has therefore been set in such a way that the controller 2 or, as the case may be, the IQ control element 12 will at rest, which is to say at the operating point, be supplied with the same I factor 34 and Q factor 36 of in each case the normalized value $1/\sqrt{2}$.

Figure 2:
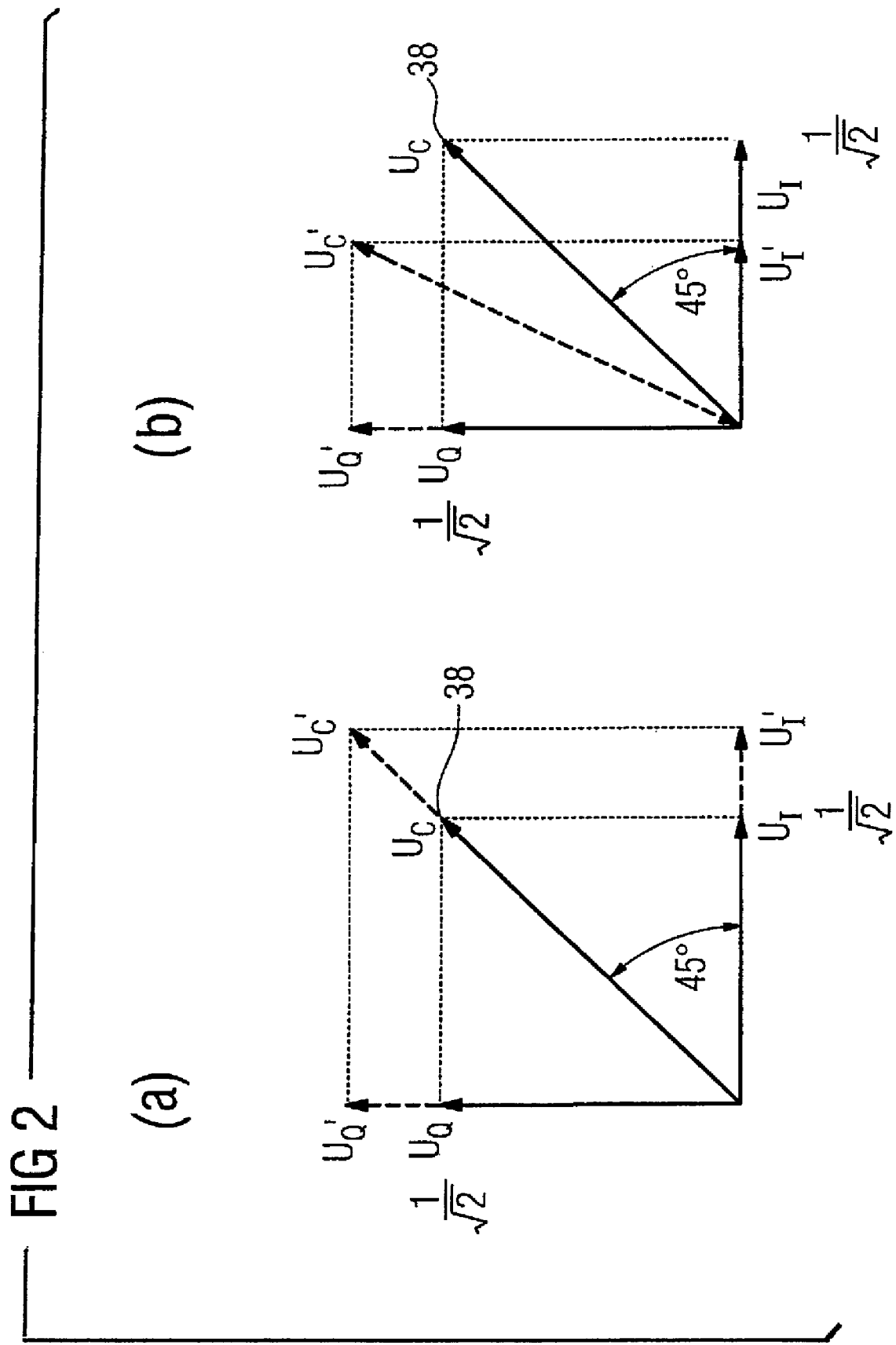
FIG. 2 shows vector diagrams of the partial signals in the IQ controller's I path and Q path, namely (a) at the operating point and during amplitude matching, and (b) at the operating point and during phase matching of the signal requiring to be amplified.

Diagram (a) in FIG. 2 shows the normalized voltages in the IQ control element 12. The partial signals weighted by the multipliers 30 and 32 are shown in FIG. 2a. The partial signal 26 in the I path 22 of the RF signal 206 is shown in diagram (a) by means of the complex voltage vector $U_I$. The partial signal 28 having a 90° phase offset relative thereto in the Q path 24 is shown in diagram (a) by means of the voltage arrow $U_Q$ rotated through 90° relative to $U_I$. The voltage arrows $U_I$ and $U_Q$ therefore each have the length $1/\sqrt{2}$ at the operating point of the IQ control element 12, which is why they add to a vector of the output voltage $U_C$ having the length 1. The output voltage is fed to the amplifier 200 in the form of the RF signal.

If the amplitude of the RF output signal 212 is too small, meaning if the actual amplitude amplification 226 (actual value) is less than the desired amplification 234, then the RF input signal 206 will need to be amplified in terms of its amplitude by the IQ control element 12. The I and Q factors 34 and 36 are for that purpose both incremented in common mode, shown in diagram (a) FIG. 2 by means of the dashed arrows UI' and UQ' that are greater to an equal extent and add up to a greater voltage value UC'. However, the phase of the output voltage UC' remains unchanged relative to that of UC, namely at 45°.

Diagram (b) of FIG. 2 shows in contrast thereto how the phase can be controlled in the RF output signal 212 through driving of the I factor and Q factor 34 and 36 in push-pull mode by changing the phase of the voltage vector $U_C$, which is to say prior to amplification by the amplifier 200. In diagram (b) the I factor 34 is reduced proceeding from its value $1/\sqrt{2}$ and the Q factor 36 is correspondingly increased by the same value. Although the phase of the voltage arrow $U_{C'}$ is hence offset, meaning turned, by the desired value relative to the voltage $U_C$, said arrow still has the same amplitude as $U_C$.

Figure 3:
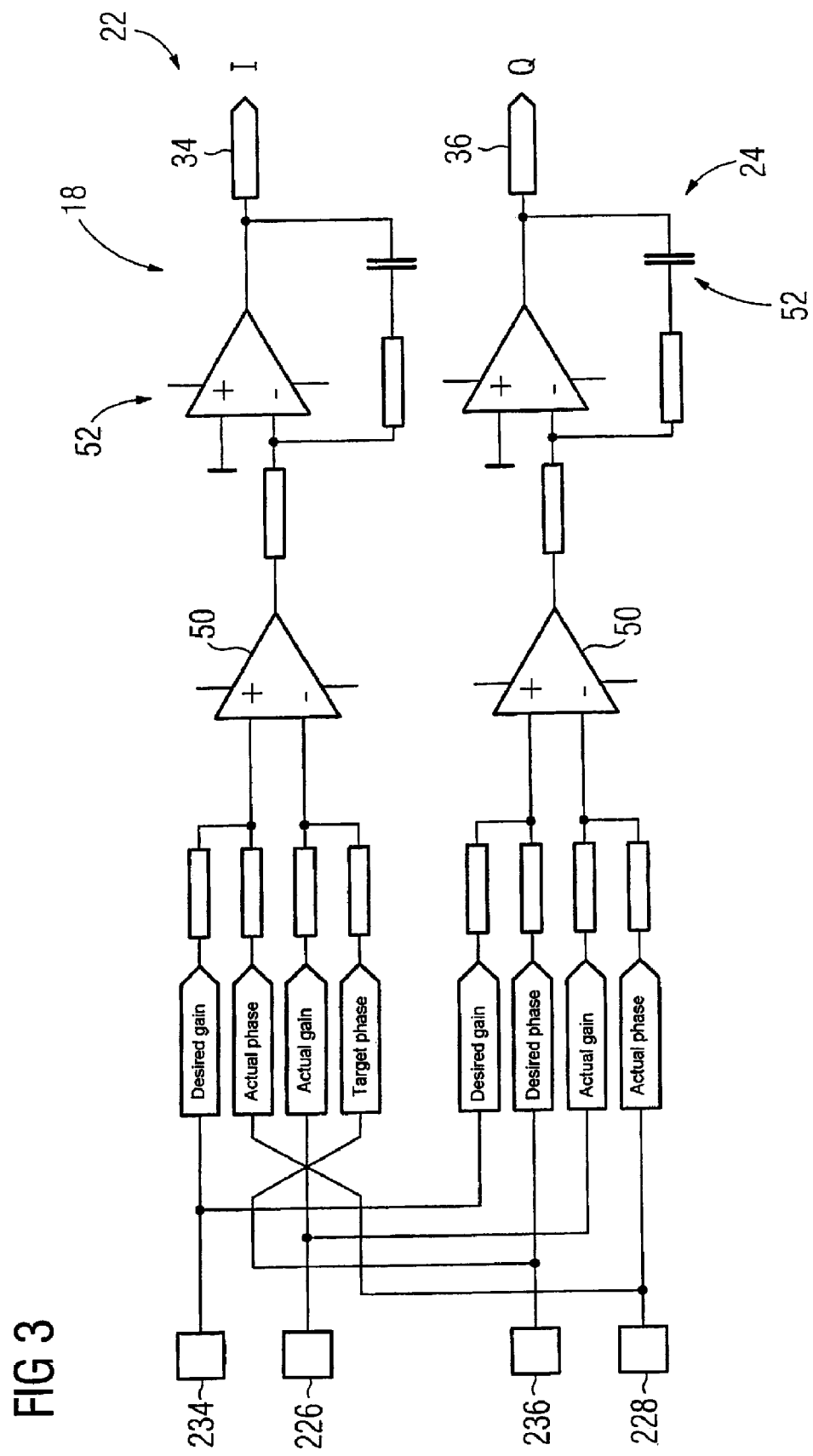
FIG. 3 shows an analog circuit implementation of the PI controller shown in FIG. 1 with operational amplifiers.

FIG. 3 shows the internal structure of the IQ controller 18 in purely analog form. The I path 22 and Q path 24 therein are identical in structure. Each has a differential amplifier 50 downstream of which at its output is connected a PI controller, likewise of analog design, that need not be explained further. Here as well, any other type of controller (PID, I, P, ...) can be used. In the I path 22 and Q path 24 both the desired amplification 234 and the actual amplitude amplification 226 are led in push-pull mode to the non-inverting and inverting inputs of the differential amplifier 50 to achieve push-pull driving of the I factor 34 and Q factor 36 explained in FIG. 2a.

To achieve the corresponding push-pull mode in terms of the phase, the desired phase 236 and actual phase difference 228 are by contrast each led crossed-over to the two paths' corresponding differential amplifier inputs.

Although modifications and changes may be suggested by those skilled in the art, it is the intention of the inventors to embody within the patent warranted hereon all changes and modifications as reasonably and properly come within the scope of their contribution to the art.

We claim as our invention:

1. A controller for a radio-frequency (RF) amplifier comprising:

an IQ control element, supplied with an RF signal to be amplified, said RF signal having a magnitude and a phase and said IQ control element adjusting said magnitude and phase of said RF signal;

said IQ control element containing a signal splitter that splits said RF signal into two partial signals having a 90° phase offset relative to each other, respectively in an I path and a Q path, said I path comprising an I path multiplier that multiplies the partial signal in said I path by an I factor, said Q path having a Q path multiplier that multiplies the partial signal in said Q path by a Q factor, and a summing unit connected to said I path and to said Q path that sums the partial signals after respective multiplication thereof in the I path and the Q path;

a detector having a first input to which said RF signal is supplied that is also supplied to said IQ control element, and an input to which an RF signal amplified by the RF amplifier is supplied, said detector determining an actual phase difference and an actual amplification between the respective signals at the first and second inputs;

an IQ controller that determines said I factor and said Q factor from said actual phase difference and a desired phase difference and said actual amplification and a desired amplification, said IQ controller having an operating point at which said I factor and said Q factor are equal in magnitude if said actual phase difference and said desired phase difference are equal and said actual amplification and said desired amplification are equal.

2. A controller as claimed in claim 1 wherein said IQ controller is an analog controller.

3. A controller as claimed in claim 1 wherein said IQ controller comprises two parallel control paths for said I factor and said Q factor that are decoupled from each other.

4. A controller as claimed in claim 3 wherein said two control paths are identical to each other.

5. A controller as claimed in claim 3 wherein each of said two control paths comprises a differential amplifier having two inputs, the two inputs of the respective differential amplifiers being driven in terms of said actual amplification and said desired amplification in a common mode and being driven in terms of said actual phase difference and said desired phase difference in push-pull mode with respect to said two control paths.

6. A controller as claimed in claim 5 wherein each of said control links comprises a control amplifier connected downstream of the differential amplifier in that control path.

7. A controller as claimed in claim 5 wherein each control amplifier is a PI controller.

8. A controller as claimed in claim 1 wherein said detector is an integrated logarithmic detector.

* * * * *